(12) United States Patent
Soyano

(10) Patent No.: US 10,637,168 B2
(45) Date of Patent: Apr. 28, 2020

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Shin Soyano, Shiojiri (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 26 days.

(21) Appl. No.: 15/821,861

(22) Filed: Nov. 24, 2017

(65) Prior Publication Data

US 2018/0183161 A1 Jun. 28, 2018

(30) Foreign Application Priority Data

Dec. 28, 2016 (JP) ................................. 2016-255509

(51) Int. Cl.
*H01R 12/58* (2011.01)
*H05K 3/28* (2006.01)
(Continued)

(52) U.S. Cl.
CPC ............. *H01R 12/585* (2013.01); *H01R 4/70* (2013.01); *H01R 43/18* (2013.01); *H01R 43/205* (2013.01); *H05K 1/142* (2013.01); *H05K 3/28* (2013.01); *H01L 23/49811* (2013.01); *H01L 23/5383* (2013.01); *H01L 25/072* (2013.01); *H01L 25/115* (2013.01); *H01L 2224/32245* (2013.01);
(Continued)

(58) Field of Classification Search
CPC ...... H01R 12/585; H01R 12/523; H01R 4/70; H01R 43/18; H01R 43/205; H01R 12/58; H01R 13/41; H01L 1/142; H01L 23/5383; H01L 25/072; H01L 25/115; H01L 2224/32245; H01L 2224/45124; H01L 2224/48227; H01L 2224/49175; H01L 2924/13055; H01L 2924/13091; H01L 23/49811; H05K 3/0014; H05K 3/4015; H05K 2201/09118; H05K 2201/10166; H05K 2201/10303; H05K 2201/10424; H05K 2201/10522; H05K 1/142; H05K 3/28; H05K 2203/1327
USPC .................. 439/84, 81, 752.5, 712, 715, 717
See application file for complete search history.

(56) References Cited

U.S. PATENT DOCUMENTS 6,159,052 A * 12/2000 Meng ....................... H01R 29/00
439/489
6,305,949 B1 * 10/2001 Okuyama ............. H01R 12/585
439/75
(Continued)

FOREIGN PATENT DOCUMENTS

JP   H10149863 A   6/1998
JP   H11166168 A   6/1999
(Continued)

*Primary Examiner* — Travis S Chambers

(57) ABSTRACT

A semiconductor device is provided, in order to prevent tilt of a terminal pin in the semiconductor device with a printed board in which the terminal pin is pressed, the semiconductor device comprising a printed board, a plurality of pins pressed in the printed board, a resin block in which a plurality of through holes are formed, the plurality of pins respectively pressed in the plurality of through holes, and a resin case covering at least a part of the printed board and the resin block.

13 Claims, 10 Drawing Sheets

(51) Int. Cl.
*H01R 4/70* (2006.01)
*H01R 43/18* (2006.01)
*H01R 43/20* (2006.01)
*H05K 1/14* (2006.01)
*H01L 25/11* (2006.01)
*H01R 13/41* (2006.01)
*H01L 23/498* (2006.01)
*H01L 23/538* (2006.01)
*H01L 25/07* (2006.01)
*H05K 3/00* (2006.01)
*H05K 3/40* (2006.01)

(52) U.S. Cl.
CPC ............. *H01L 2224/45124* (2013.01); *H01L 2224/48227* (2013.01); *H01L 2224/49175* (2013.01); *H01L 2924/13055* (2013.01); *H01L 2924/13091* (2013.01); *H01R 12/58* (2013.01); *H01R 13/41* (2013.01); *H05K 3/0014* (2013.01); *H05K 3/4015* (2013.01); *H05K 2201/09118* (2013.01); *H05K 2201/10166* (2013.01); *H05K 2201/10303* (2013.01); *H05K 2201/10424* (2013.01); *H05K 2201/10522* (2013.01); *H05K 2203/1327* (2013.01)

(56) References Cited

U.S. PATENT DOCUMENTS

| | | | | |
|---|---|---|---|---|
| 6,995,461 | B2* | 2/2006 | Soyano | H01L 23/045 257/678 |
| 7,048,595 | B2* | 5/2006 | Nakamura | H01R 12/585 439/75 |
| 7,575,443 | B2* | 8/2009 | Decker | H05K 1/144 439/75 |
| 8,107,255 | B2* | 1/2012 | Sakamoto | H05K 1/144 361/695 |
| 8,900,008 | B2* | 12/2014 | Day, Jr. | H05K 13/04 439/567 |
| 9,634,407 | B2* | 4/2017 | Endo | H01R 12/585 |
| 9,820,402 | B2* | 11/2017 | McCurley | H05K 7/1417 |
| 2007/0077813 | A1* | 4/2007 | Matsumura | H01R 12/585 439/578 |
| 2008/0050947 | A1* | 2/2008 | Nunokawa | H01R 12/585 439/82 |
| 2009/0233468 | A1 | 9/2009 | Yamashita et al. | |
| 2014/0285985 | A1* | 9/2014 | Tanaka | H05K 5/0069 361/752 |

FOREIGN PATENT DOCUMENTS

JP 2007103088 A 4/2007
JP 2009218455 A 9/2009

\* cited by examiner

SEMICONDUCTOR DEVICE AND SEMICONDUCTOR DEVICE MANUFACTURING METHOD

The contents of the following Japanese patent application are incorporated herein by reference:
NO. 2016-255509 filed on Dec. 28, 2016.

BACKGROUND

1. Technical Field

The present invention relates to a semiconductor device and a semiconductor device manufacturing method.

2. Related Art

Conventionally, a press-fit connection by pressing a terminal pin in a through hole provided in a wiring board to electrically connect has been known (for example, refer to Patent Document 1). Also, as a related technique, Patent Document 2 and Patent Document 3 have been known.

PRIOR ART LITERATURE

Patent Document

[Patent Document 1] Japanese Patent Application Publication No. 2009-218455
[Patent Document 2] Japanese Patent Application Publication No. Hei10-149863
[Patent Document 3] Japanese Patent Application Publication No. Hei11-168168

SUMMARY

In a semiconductor device accommodating a semiconductor chip and the like, when setting a printed board in a molding mold of a resin case so as to perform integral-molding, if the printed board is in a state that terminal pins are pressed in the printed board, the terminal pins may be tilted or bent when setting.

In a first aspect of the present invention, a semiconductor device is provided. The semiconductor device may include a printed board, a plurality of pins, a resin block, and a resin case. The plurality of pins may be pressed in the printed board. A plurality of through holes may be formed in the resin block. The plurality of pins may be respectively pressed in the plurality of through holes. The resin case may cover at least a part of the printed board and the resin block.

The printed board may have a plurality of board through holes. Each of the plurality of pins may include a first press-fit section and a second press-fit section. A plurality of the first press-fit sections may be pressed in the plurality of board through holes and respectively in contact with an inner surface of each board through hole by an elastic force. A plurality of the second press-fit sections may be pressed in the plurality of through holes of the resin block and respectively in contact with an inner surface of each through hole of the resin block by an elastic force.

A bottom surface of the resin block may have been formed flat so as to be in close contact with a front surface of the printed board.

The semiconductor device may have a plurality of the resin blocks. The pins provided in different printed boards may be pressed in each of the resin blocks. The semiconductor device may include a coupling section. The coupling section may couple the plurality of resin blocks across a plurality of the printed boards.

The coupling section may be thinner than the plurality of resin blocks.

The coupling section may be embedded in resin of the resin case.

A resin material forming the plurality of resin blocks and the coupling section may have a smaller shrinkage percentage than that of a resin material forming the resin case.

At least one resin block of the plurality of resin blocks may have a depression in an upper surface. The depression may divide the plurality of pins into two or more groups. At least one pin provided in a position between the depression and the coupling section may be a monitoring terminal of a main power supply.

A support section for supporting a main terminal may be further included between the coupled plurality of resin blocks.

The through hole formed in the resin block may be tapered on the printed board side.

The resin block may have a first step difference on a side surface.

The resin block may further have, on a part of the side surface, a second step difference having an area larger than that of the first step difference.

The resin block may have a depression in the upper surface. The depression may divide the plurality of pins into two or more groups.

In a second aspect of the present invention, a semiconductor device manufacturing method is provided. The semiconductor device manufacturing method may include a step of pressing a plurality of pins in a printed board, a step of preparing a resin block, a step of engaging the resin block with the plurality of pins, and a step of resin molding a resin case. The step of preparing the resin block may include preparing a resin block in which a plurality of through holes are formed. The step of engaging the resin block with the plurality of pins may include engaging the resin block with the plurality of pins so that the plurality of pins are respectively pressed in the plurality of through holes. The step of resin molding the resin case may include resin molding the resin case so as to cover at least a part of the printed board and the resin block.

Note that the summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims. Also, all the combinations of the features described in the embodiments are not necessarily essential to means provided by aspects of the invention.

Figure 1:
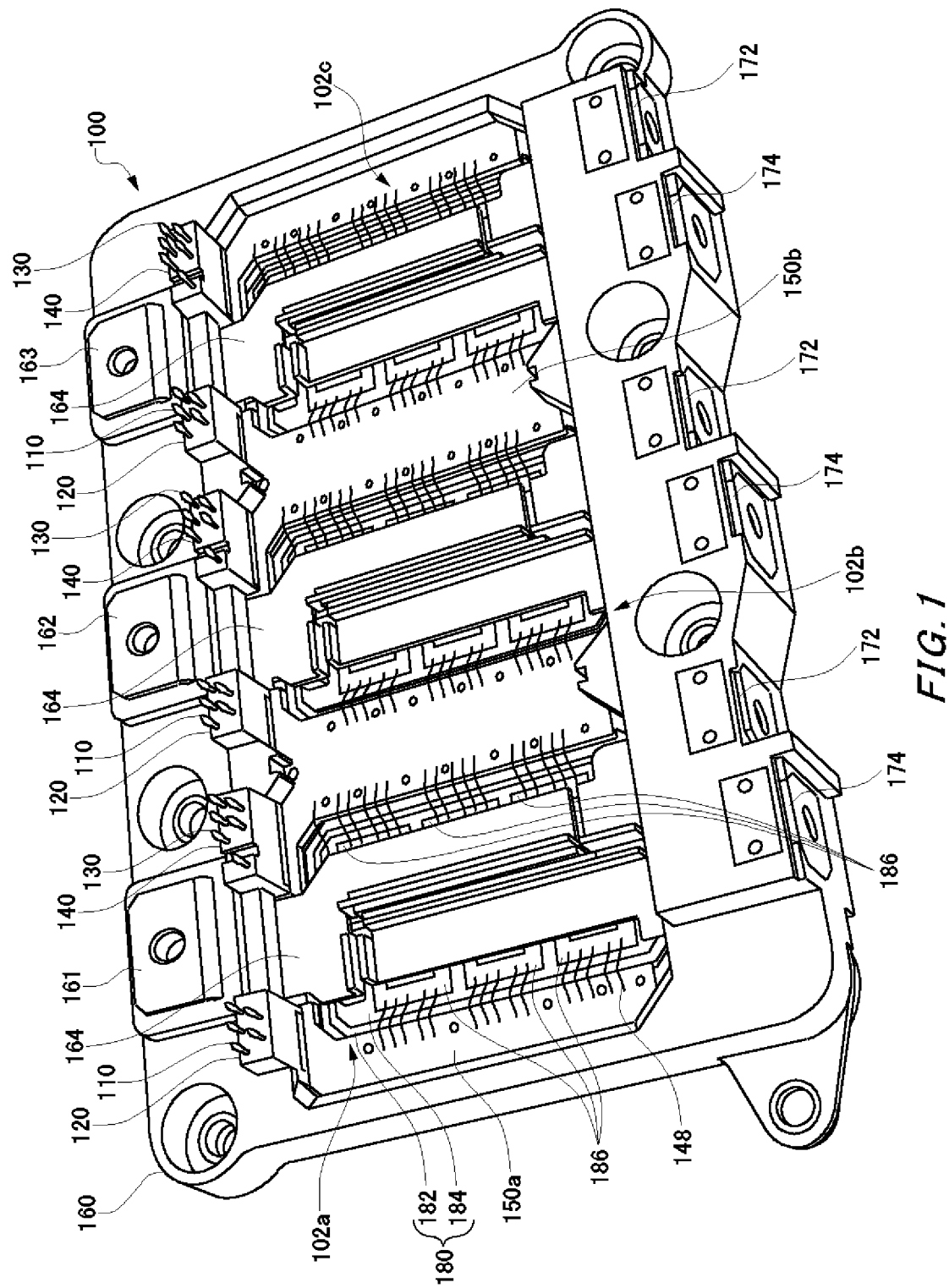
FIG. 1 is a perspective view showing a schematic view of a semiconductor device 100 according to a first embodiment of the present invention.

FIG. 1 is a perspective view showing a schematic view of a semiconductor device 100 according to a first embodiment of the present invention. The semiconductor device 100 accommodates an electronic circuit such as a semiconductor chip 186 therein. The semiconductor device 100 of the present example has a plurality of terminal pins 110, a resin block 120, and a printed board 150. The printed board 150 of the present example may include an L-shaped printed board 150a and a T-shaped printed board 150b. Base ends of the plurality of terminal pins 110 are pressed in the printed board 150. Also, the plurality of terminal pins 110 are pressed in through holes of the resin block 120.

The semiconductor device 100 includes a plurality of terminal pins 130 and a resin block 140. Base ends of the plurality of terminal pins 130 are pressed in the printed board 150. Also, the plurality of terminal pins 130 are pressed in through holes of the resin block 140. The semiconductor device 100 includes a resin case 160. The resin case 160 covers at least a part of the printed board 150 and the resin blocks 120, 140. In the present example, the printed board 150 and the resin blocks 120 and 140 are integrally molded.

In the present example, the semiconductor device 100 includes a U terminal 161, a V terminal 162, and a W terminal 163 on a front surface of the resin case 160. The U terminal 161, the V terminal 162, and the W terminal 163 may be three-phase output terminals. Also, the semiconductor device 100 may include a P terminal 172 and an N terminal 174 on the front surface of the resin case 160. The P terminal 172 is an input terminal which may be connected to a positive electrode of a main power supply, and the N terminal 174 is an input terminal which may be connected to a negative electrode of the main power supply.

In the semiconductor device 100, the P terminal 172 is connected to the positive electrode and the N terminal 174 is connected to the negative electrode, respectively. In the present example, at least a part of the plurality of terminal pins 110 and the plurality of terminal pins 130 may serve as a control terminal. A control signal may be applied to the plurality of terminal pins 110 and the plurality of terminal pins 130. The U terminal 161, the V terminal 162, and the W terminal 163 output voltages in response to the control signal. A plurality of sets of the P terminals 172 and the N terminals 174 may be provided on one side in a longitudinal direction of the resin case 160. In the present example, the P terminal 172 and the N terminal 174 are alternately provided on the side surface along the longitudinal direction of the resin case 160. In the present example, viewed from the side surface direction, a step difference is provided between the P terminal 172 and the N terminal 174 to allow a component such as a capacitor to be easily mounted. On the other hand, the U terminal 161, the V terminal 162, and the W terminal 163 may be provided on the other side in the longitudinal direction of the resin case 160. The plurality of sets of the P terminals 172 and the N terminals 174, and the U terminal 161, the V terminal 162 and the W terminal 163 are arranged in the resin case 160 by interposing a laminated substrate 180.

The semiconductor device 100 includes the laminated substrates 180 respectively housed in accommodating sections 102a, 102b, and 102c. In the present example, the accommodating sections 102a, 102b, and 102c are between the adjacent printed board 150a and printed board 150b. The laminated substrate 180 may include an insulating substrate 182 and a metal foil 184. The metal foil 184 is formed on an upper surface of the insulating substrate 182. The metal foil 184 may be a copper foil.

The semiconductor device 100 includes a semiconductor chip 186 on the metal foil 184 in the accommodating sections 102a, 102b, and 102c. A plurality of the semiconductor chips 186 may be arranged side by side. The semiconductor chip 186 may be an element such as Insulated Gate Bipolar Transistor (IGBT), MOSFET, Free Wheeling Diode (FWD), and Reverse Conducting IGBT (RC-IGBT). In the present example, the semiconductor chip 186 is an RC-IGBT.

The semiconductor chip 186 of the present example is bonded on the metal foil 184 via a solder. For example, in a case where the semiconductor chip 186 is an IGBT, a back surface side of the semiconductor chip 186 is a collector electrode, and the collector electrode is electrically connected to the metal foil 184.

An internal wiring terminal 164 may be provided on the semiconductor chip 186. For example, the internal wiring terminal 164 electrically connects each emitter electrode of a plurality of the semiconductor chips 186 being IGBTs. The plurality of semiconductor chips 186 may be electrically connected in parallel between the metal foil 184 and the internal wiring terminal 164. The internal wiring terminal 164 may be arranged along the printed board 150. A control electrode such as a gate electrode in the semiconductor chip 186 is electrically connected to the printed boards 150a, 150b by a bonding wire 148 using aluminum and the like, for example. Note that the inner part of the semiconductor device 100 may be filled with resin such as epoxy resin.

Figure 2:
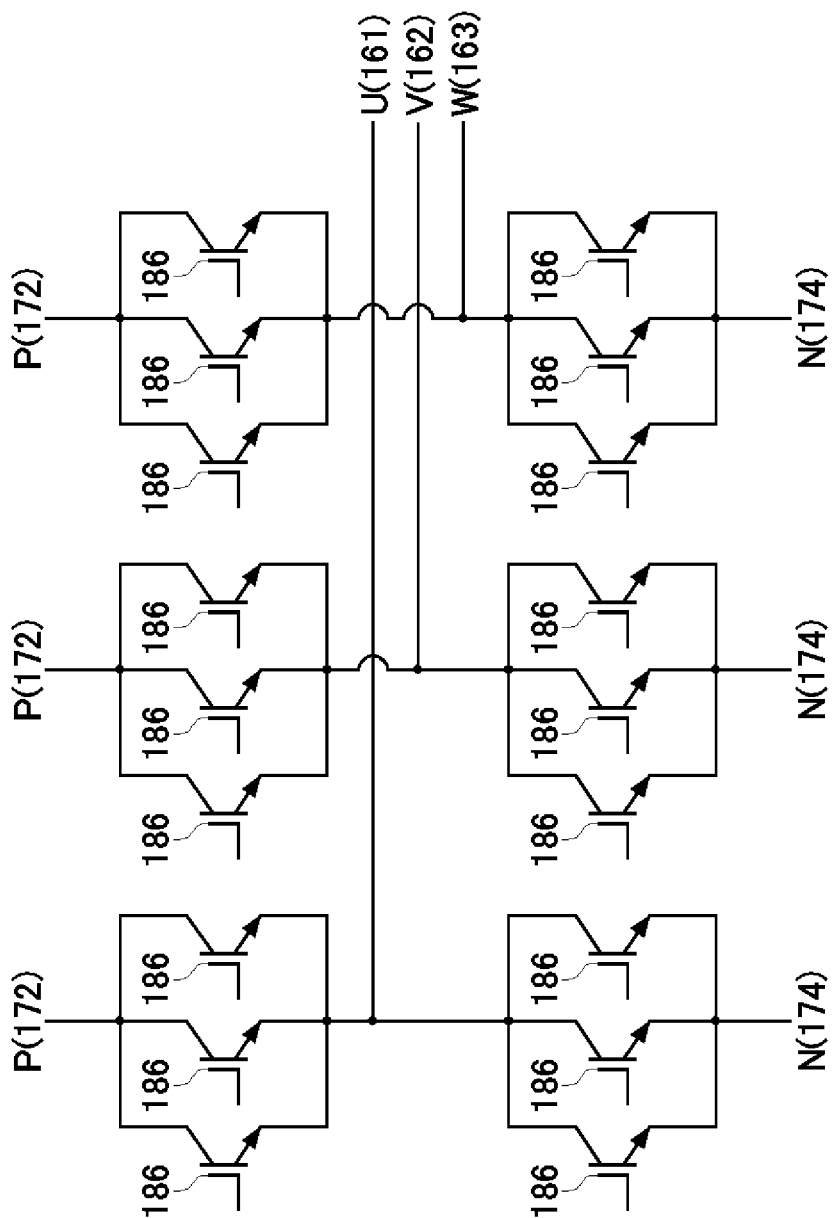
FIG. 2 is a circuit diagram showing a schematic view of a main circuit of the semiconductor device 100 according to the first embodiment.

FIG. 2 is a circuit diagram showing a schematic view of a main circuit in a semiconductor device according to a first embodiment. This example shows a three-phase inverter, which has 6 sets of semiconductor chips 186 as arms performing switching. Each arm has one set of three semiconductor chips 186. The three semiconductor chips 186 in each arm are electrically connected in parallel.

The semiconductor chip 186 may include an emitter electrode, a control electrode pad, and a collector electrode which is on the opposite side interposing the emitter electrode and the substrate. The control electrode pad may include a gate electrode, a sense-emitter electrode, and an anode electrode and a cathode electrode which are for temperature measurement.

Two sets of arms may be set as a pair to constitute legs. The illustrated example includes three legs. In each leg, the P terminal 172 is electrically connected to the collector electrode of the semiconductor chip 186 included in an upper arm. The N terminal 174 is electrically connected to the emitter electrode of the semiconductor chip 186 included in a lower arm. Also, the emitter electrode of the semiconductor chip 186 of the upper arm and the collector electrode of the semiconductor chip 186 of the lower arm are electrically connected to the U terminal 161 and the like. These electrical connections may be implemented via a circuit formed on the metal foil 184 on the laminated substrate 180 and the internal wiring terminal 164 and the like. Also, the control electrode pad may be connected to an external control circuit via the printed board 150, the terminal pins 110, 130, and the like.

Figure 3:
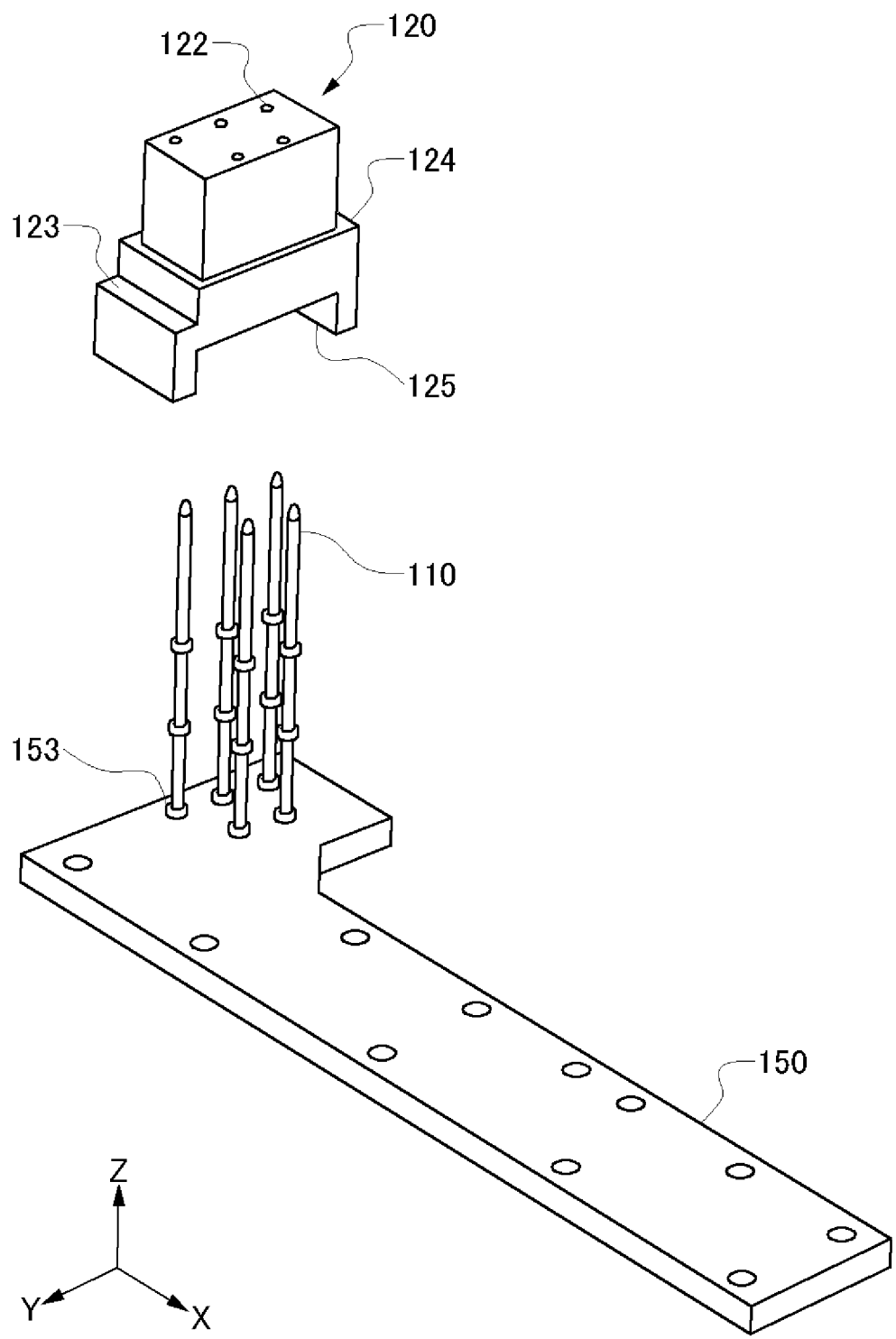
FIG. 3 is a drawing showing a terminal pin 110, a resin block 120, and a printed board 150.

FIG. 3 is a drawing showing the terminal pin 110, the resin block 120, and the printed board 150. The printed board 150 has a plurality of board through holes 153. Base ends (end portions on −Z side) of the plurality of terminal pins 110 are respectively pressed in the plurality of board through holes 153. The printed board 150 has a base material and a wiring layer formed on the base material. The printed board 150 is also referred to as a printed circuit board (PCB) or a circuit wiring board.

The terminal pins 110 are provided by pressing in the board through holes 153 of the printed board 150 so as to stand on the upper surface of the printed board 150. The terminal pins 110 pressed in the board through holes 153 are electrically connected to the wiring layer through the board through holes 153. The base ends of the terminal pins 110 may also be exposed or protrude on the back surface side of the printed board 150.

A plurality of block through holes 122 are formed in the resin block 120. The block through holes 122 may be through holes penetrating the resin block 120 between an upper surface and a lower surface of the resin block 120 in the Z direction. The plurality of terminal pins 110 are respectively pressed in the plurality of block through holes 122. Therefore, the terminal pins 110 of the present example are not only pressed in the printed board 150 but also pressed in the resin block 120. The phrase "pressed in the resin block 120" means a state that at least a part of the terminal pin 110 is in contact with an inner wall of the block through holes 122 and the resin block 120 is pressuring the terminal pin 110 at the portion of the inner wall with which the terminal pin 110 is in contact.

The resin block 120 has a first step difference 124 on a side surface. The first step difference 124 suppresses an occurrence of burr when performing the resin molding so as to integrate the resin block 120 with the resin case 160. Specifically, by aligning a mold of the resin case 160 with a corner portion formed by the side surface of the resin block 120 and the first step difference 124, an unwanted resin flowing along the side surface of the resin block 120 is prevented and the occurrence of burr is suppressed.

The resin block 120 may have a second step difference 123 on the side surface. The second step difference 123 may have an area larger than that of the first step difference 124. The second step difference 123 is a shoulder portion for applying a force when engaging the resin block 120 with the plurality of terminal pins 110. Although FIG. 3 shows a case where the second step difference 123 is formed on one side surface of the resin block 120, the second step difference 123 may also be formed on a plurality of side surfaces of the resin block 120. By providing the second step difference 123, a sufficient force is easily applied to press the terminal pins 110 in the block through holes 122 of the resin block 120.

Figure 4:
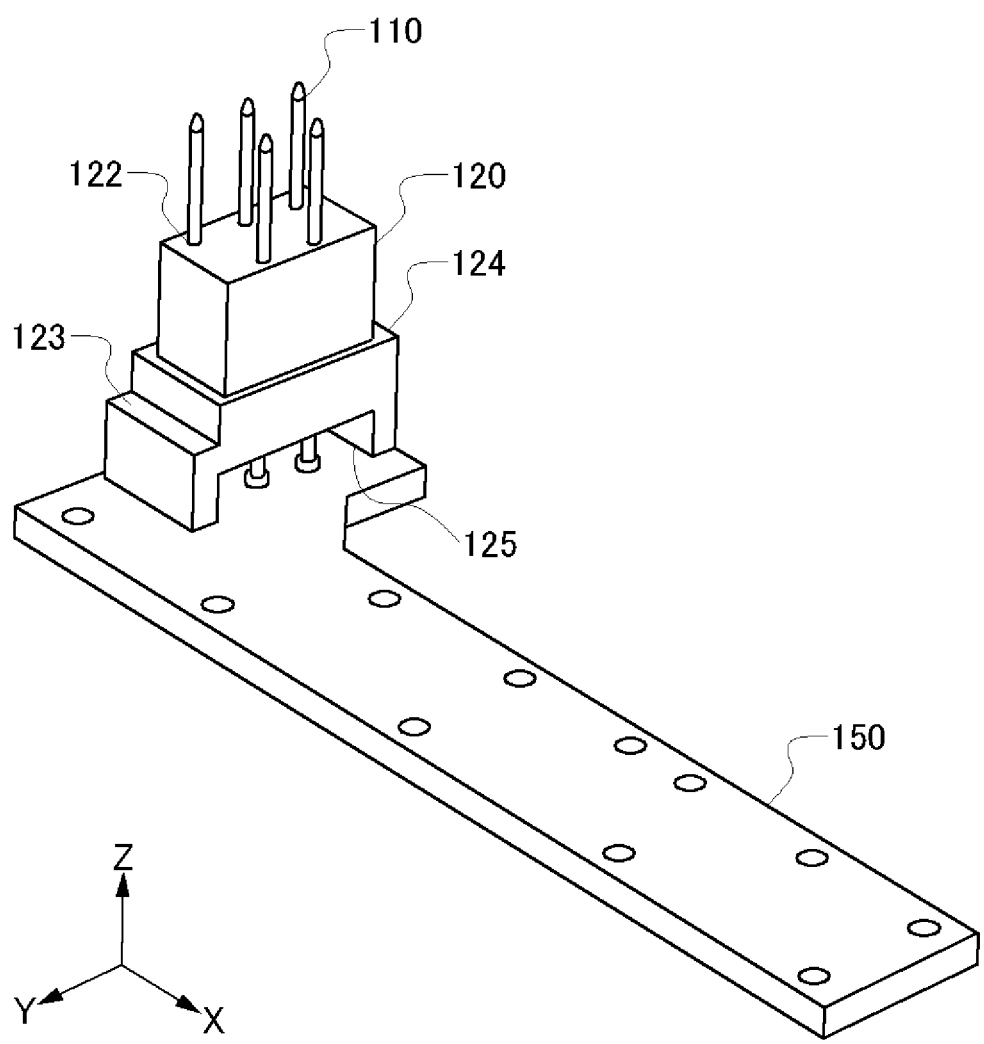
FIG. 4 is a drawing showing a state that the resin block 120 is engaged with the terminal pin 110.

FIG. 4 is a drawing showing a state that the resin block 120 is engaged with the terminal pin 110. In the present example, the resin block 120 has a pair of leg sections 125 on a bottom surface side. The leg sections 125 are provided on both ends of the bottom surface of the resin block 120. A gap is formed between the pair of leg sections 125. When performing the resin molding so as to integrate the resin block 120 with the resin case 160, by causing the resin to flow below the resin block 120 from the gap to surround the leg sections 125, the resin block 120 is easily integrated with the resin case 160.

Although the configurations of the terminal pins 110, the resin block 120, and the printed board 150 are described in FIG. 3 and FIG. 4, the structures of the terminal pins 130, the resin block 140, and the printed board 150b are also similar, except for the outer shapes of the printed board 150 and the resin block 140. Therefore, the description is omitted to avoid repetition.

A manufacturing method of the semiconductor device 100 in the present example will be described using FIG. 1 to FIG. 4. The manufacturing method of the semiconductor device 100 includes a pressing step of pressing a plurality of terminal pins 110 in the printed board 150, as shown in FIG. 3. Similarly, a plurality of terminal pins 130 may also be pressed in the printed board 150b and the like. The manufacturing method of the semiconductor device 100 includes, in parallel with the pressing step, a step of preparing the resin blocks 120, 140.

As shown in FIG. 4, the manufacturing method of the semiconductor device 100 includes a step of engaging the resin block 120 with the plurality of terminal pins 110 from a positive direction of a Z axis so that the plurality of terminal pins 110 are pressed in the plurality of block through holes 122. Similarly, also in the printed board 150b and the like, the resin block 140 is engaged with the plurality of terminal pins 130 so that the plurality of terminal pins 130 are pressed in the plurality of block through holes.

As shown in FIG. 4, a resultant object being a combination of the printed boards 150a, 150b, the terminal pins 110, 130, and the resin blocks 120, 140 is set together with other terminals and the like in a mold for molding the resin case 160 to form the resin case 160 using resin by an integral-molding (insert molding) process. Specifically, the U terminal 161, the V terminal 162, the W terminal 163, the internal wiring terminal 164, the P terminal 172, the N terminal 174, and the like may also be integrally molded at the same time.

As shown in FIG. 1, a part of the bottom surface sides and the side surfaces of the resin blocks 120, 140 are covered by the resin case 160. One end of a part of the side surfaces may be located on the side surface between the second step difference 123 and the first step difference 124. In this way, the manufacturing method of the semiconductor device 100 of the present example includes a resin molding step of resin molding the resin case 160 so as to cover at least a part of the printed boards 150a, 150b and the resin blocks 120, 140. An upper surface of a part of the resin case 160 may substantially flush with the upper surface of the first step difference 124.

According to the manufacturing method of the semiconductor device 100 of the present example, it does not need to integrally mold the resin blocks 120, 140 with the terminal pins 110, 130 in advance prior to the resin molding of the resin case 160. Therefore, compared with a case of integrally molding the resin blocks 120, 140 with the terminal pins 110, 130, the manufacturing process can be simplified and the manufacturing cost can be reduced.

In the present example, for the resin blocks 120, 140, it does not need to integrally mold with the terminal pins 110, 130. For the resin blocks 120, 140, the molding may be separately performed by a usual molding technology not by the insert molding. By the usual molding technology not by the insert molding, the manufacturing cost can be reduced. Also, because it does not need to integrally mold the resin blocks 120, 140 with the terminal pins 110, 130 in advance, the burr of the resin does not occur at the roots of the terminal pins 110, 130. Therefore, it does not need to add a deburring process.

On the other hand, different from a case of mounting the terminal pins 110, 130 only on the printed board 150 and setting the printed board 150 in the molding mold of the resin case 160 to integrally mold, because the resin blocks 120 and 140 are engaged with the terminal pins 110, 130, the terminal pins 110, 130 are not tilted or bent when setting. Therefore, the printed board 150 is easily appropriately set in the molding mold of the resin case 160.

Figure 5:
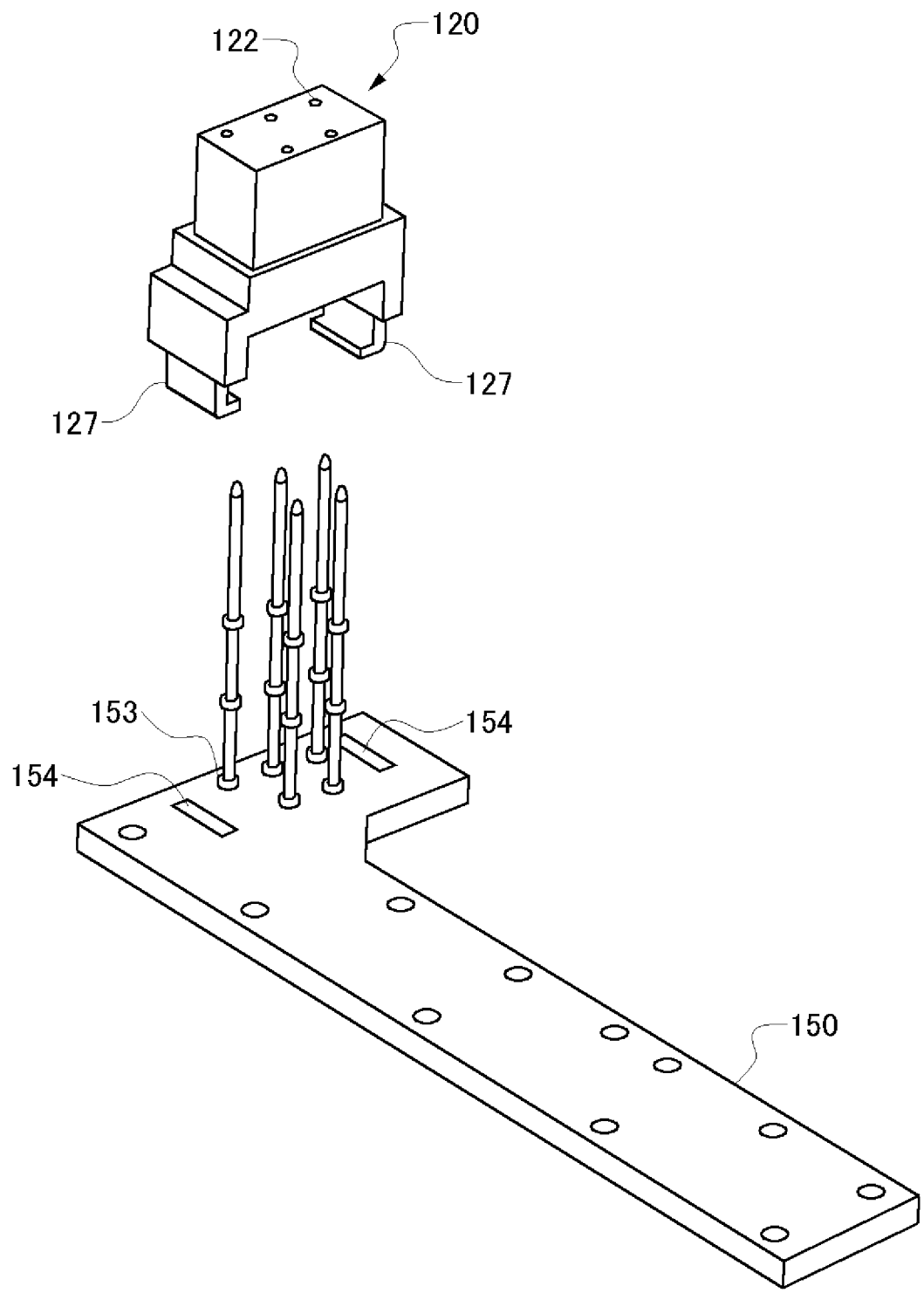
FIG. 5 is a drawing showing another example of the resin block 120 and the printed board 150.

FIG. 5 is a drawing showing another example of the resin block 120 and the printed board 150. The resin block 120 of the present example is provided with a locking section 127 on a bottom portion. Meanwhile, a locking hole 154 is formed in the printed board 150 of the present example. The locking section 127 is inserted into the locking hole 154 and locked thereon. That is, a pawl portion of the locking section 127 fixes the resin blocks 120 to the printed board 150 by penetrating the locking hole 154 and abutting on a back surface of the printed board 150. Note that the locking may be similarly performed between the resin block 140 and the printed board 150b and the like.

According to the example shown in FIG. 5, the resin block 120 is fixed to the printed board 150 by the locking section 127. Therefore, this can prevent the terminal pins 110, 130 pressed in the resin blocks 120, 140 from slipping off from the resin blocks 120, 140. Particularly, the present invention is easily applied even to a case where the pressing force is weak, such as a case where press-fit pins are not used as the terminal pins 110, 130.

Figure 6:
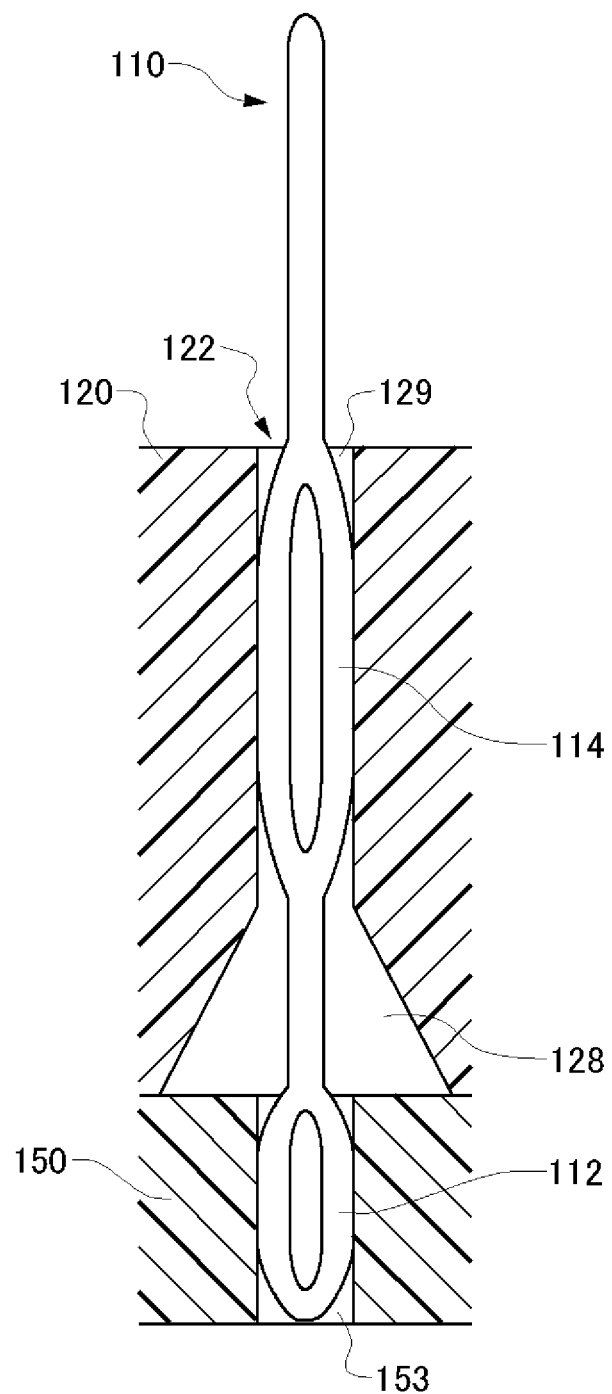
FIG. 6 is a drawing showing one example of the terminal pin 110.

FIG. 6 is a drawing showing one example of the terminal pin 110. Although the terminal pins 110 and the resin block 120 are described in FIG. 6 as an example, the terminal pins 130 and the resin block 140 may also have similar configurations to those of the terminal pins 110 and the resin block 120.

The terminal pin 110 of the present example is a press-fit pin. The press-fit pin includes a press-fit section in a terminal inserted into a through hole of a subject material. By a deformation pressure of the press-fit section, the terminal and the through hole contact to each other. The terminal pins 110 of the present example include first press-fit sections 112 and second press-fit sections 114. The first press-fit sections 112 are respectively pressed into a plurality of board through holes 153, and respectively contact an inner surface of each board through hole 153 by an elastic force. By the first press-fit sections 112, the terminal pins 110 and the printed board 150 are electrically connected.

The second press-fit sections 114 are pressed in the plurality of block through holes 122 of the resin block 120, and respectively contact an inner surface of each block through hole 122 of the resin block by an elastic force. The first press-fit sections 112 and the second press-fit sections 114 have, for example, a cross section in a cruciform shape. A pin having the cruciform cross section is obtained by performing a crushing process on a wire rod. This cross section may be referred to as a cruciform-crimped structure. However, the shape of the first press-fit sections 112 and the second press-fit sections 114 is not limited to the cross sectional cruciform one. The cross section may be a surface perpendicular to an axis direction of the terminal pin 110.

The first press-fit section 112 may be provided in the base end of the terminal pin 110. The second press-fit section 114 is formed above the first press-fit section 112, corresponding to the position of the block through hole 122 of the resin block 120. From a viewpoint of usage convenience as a terminal, it is desirable that the terminal pin 110 has no press-fit section in a portion protruding from the upper surface of the resin block 120.

In the present example, the block through hole 122 formed in the resin block 120 has a tapered portion 128 on a surface opposite to the printed board 150. Accordingly, this causes tips of the plurality of terminal pins 110 provided on the printed board 150 to be easily introduced in the plurality of block through holes 122 respectively. Note that when performing the resin molding so as to integrate the resin block 120 with the resin case 160, the resin may be injected from the bottom surface side toward the upper direction through the board through holes 153 and the block through holes 122. However, because the burr occurs if the resin is injected up to the upper surface of the resin block 120, it is desirable to suppress the resin injection.

Viewing the resin block 120 from the upper surface, the block through hole 122 is not completely filled with the resin, and a void 129 is observed. The semiconductor device 100 of the present example has the void 129 between the terminal pin 110 and the block through hole 122. By the presence of the void 129, it can be discriminated that the resin block 120 has not been integrally molded with the terminal pin 110 prior to the resin molding of the resin case 160.

Figure 7:
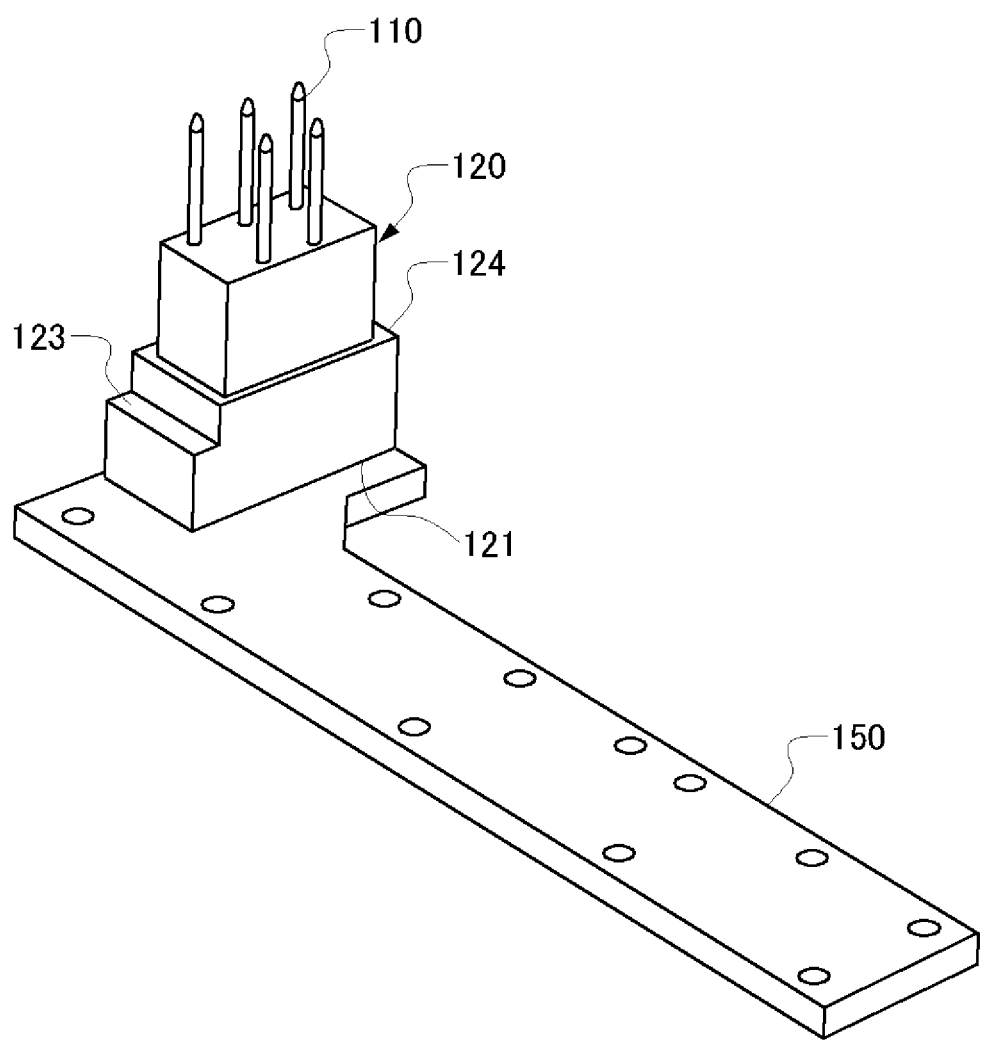
FIG. 7 is a drawing showing another example of the resin block 120.

Although the resin injection can be suppressed so that the resin is not injected up to the upper surface of the resin block 120 by adjusting the processing conditions for the resin molding of the resin case 160, the resin injection may also be suppressed according to the shape of the resin block 120 and the way how the resin block 120 is in close contact with the printed board 150. FIG. 7 is a drawing showing another example of the resin block 120. In the example shown in FIG. 7, a bottom surface 121 of the resin block 120 is formed flat so as to closely contact the front surface of the printed board 150. According to the present example, a gap does not exist between the leg sections 125 in the resin block 120 as shown in FIG. 4. Therefore, the resin injection into the resin block 120 is suppressed.

Note that, according to the present example, the resin is also injected from the bottom surface side of the printed board 150 toward the upper direction through the board through holes 153 and the block through holes 122. However, because the bottom surface 121 of the resin block 120 is formed flat so as to closely contact the front surface of the printed board 150, the injection amount of the resin into the resin block 120 can be reduced, and the resin injection is easily suppressed so that the resin is not injected up to the upper surface of the resin block 120.

Particularly, as described in FIG. 6, if the terminal pin 110 is the press-fit pin, the terminal pin 110 has been deformed into the cross sectional cruciform shape and the like. For that reason, because the gap is easily generated between the terminal pin 110 and the board through hole 153, and between the terminal pin 110 and the block through hole 122, there is a high necessity to suppress the injection amount of the resin in order to suppress the occurrence of the burr. Therefore, if the terminal pin 110 is the press-fit pin, it is desirable that the bottom surface 121 of the resin block 120 is formed flat so as to closely contact the front surface of the printed board 150.

Figure 8:
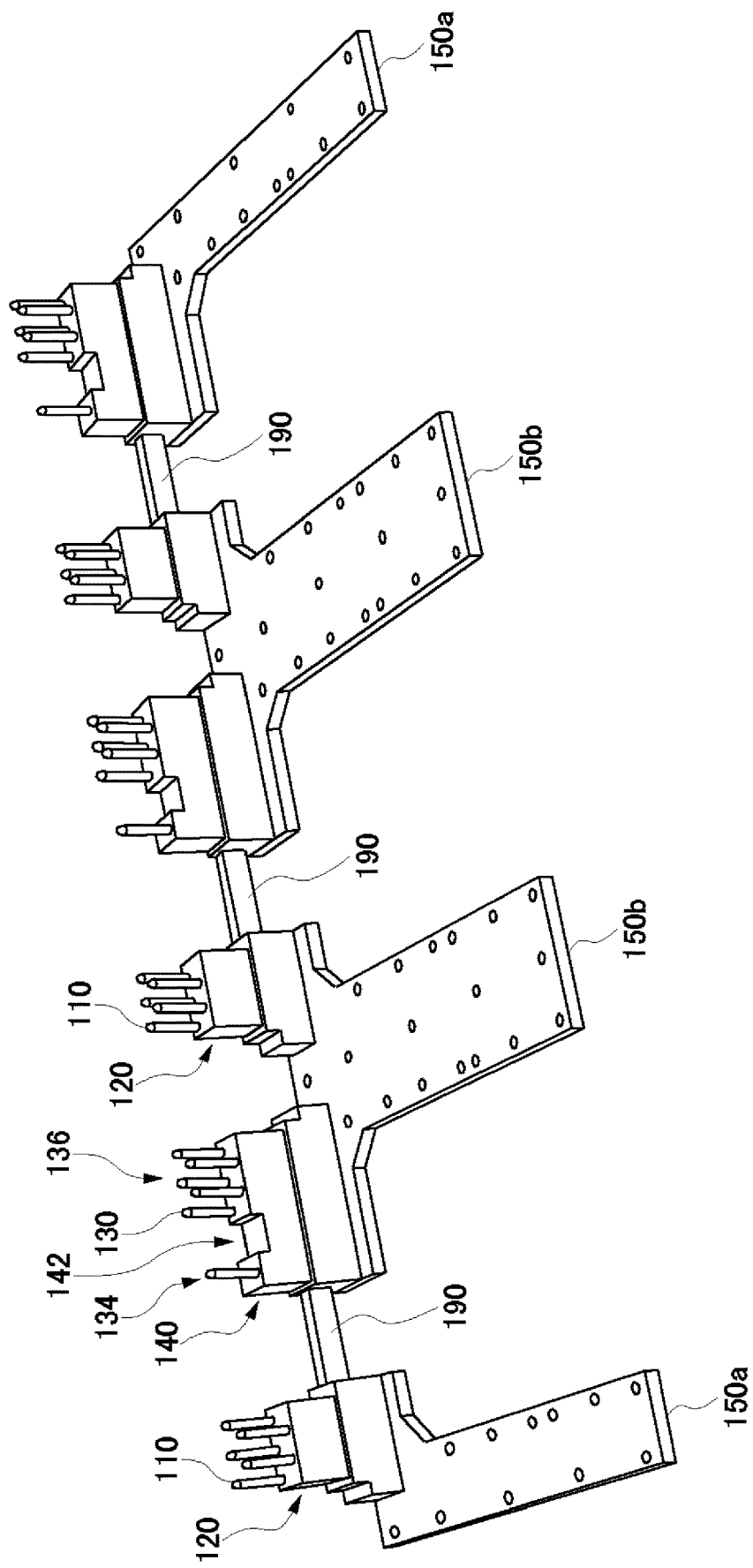
FIG. 8 is a drawing showing a coupling structure across a plurality of printed boards in a semiconductor device 100 according to a second embodiment of the present invention.

FIG. 8 is a drawing showing a coupling structure across a plurality of printed boards of a semiconductor device 100 according to a second embodiment of the present invention. In the first embodiment, the resin block 120 and the resin block 140 have been completely separated from each other.

On the other hand, the resin block 120 and the resin block 140 in the present example are coupled by a coupling section 190. Except a plurality of the resin blocks 120, 140 are coupled by the coupling section 190, the structure of the semiconductor device 100 according to the second embodiment is similar to the case of the first embodiment. Therefore, the description is omitted to avoid repetition.

The semiconductor device 100 of the present example includes the resin blocks 120 and the resin blocks 140 as a plurality of resin blocks. The terminal pins 110, 130 provided on different printed boards 150a, 150b are pressed in the resin blocks 120 and the resin blocks 140 respectively. The coupling section 190 couples the plurality of resin blocks 120, 140 across the printed board 150a and the printed board 150b which are the plurality of printed boards.

The coupling section 190 may be thinner than the resin block 120 and the resin block 140. A cross section perpendicular to an extension direction of the coupling section 190 may be smaller than the cross section of the resin block 120 and that of the resin block 140. As a volume of the coupling section 190 is larger, the influence of a recess or a depression referred to as a sink generated by molding shrinkage is easily exerted. Therefore, by causing the coupling section 190 to be thinner than the resin block 120 and the resin block 140, the influence of the sink can be reduced and a dimensional precision can be increased.

A resin material forming the resin block 120, the resin block 140, and the coupling section 190 may have a smaller shrinkage percentage than that of a resin material forming the resin case 160. For example, as a resin material, polyphenylene sulfide resin (PPS) is used. The resin material forming the resin block 120, the resin block 140, and the coupling section 190 may be polyphenylene sulfide resin having a smaller shrinkage percentage than that of polyphenylene sulfide resin forming the resin case 160.

Because the dimensional precision becomes increased as the shrinkage percentage of the resin material is smaller, the dimensional precision of the resin block 120, the resin block 140, and the coupling section 190 can be increased and positioning precision of the terminal pins 110, 130 can be increased. Meanwhile, because the material cost becomes lower as the shrinkage percentage is larger, a relatively low cost material can be used for the resin case 160 for which a high dimensional precision is not required compared with the resin block 120 and the like.

In the present example, similar to the configuration shown in FIG. 1, along the longitudinal direction of the resin case 160, the printed board 150a having an L-shaped form and an inverted L-shaped form respectively on both ends is arranged and two pieces of printed boards 150b having a T-shaped form in the center are arranged. In the present example, three sets of the coupling blocks are included, the coupling block being the resin block 120 and the resin block 140 which are coupled by the coupling section 190. A number of sets in which the coupling blocks are included is not limited to this case. The number of sets of the coupling blocks may also be one set or two sets, or may also be four sets or more.

In the present example, the coupling block of the resin block 120 and the resin block 140 coupled by the coupling section 190 may be resin molded. By pressing corresponding portions included in the coupling block in the respective terminal pins 110, 130, the adjacent different printed boards 150 are coupled by the coupling block and configure one coupling structure body.

Note that if one printed board is used instead of the plurality of printed boards 150 themselves, the printed board 150 excessively occupies space, and the areas of the accommodating sections 102a, 102b, 102c (FIG. 1) of the semiconductor device 100 become narrower. Therefore, from a viewpoint of effective utilization of space, it is preferable to use a plurality of printed boards 150. According to the present example, in spite of using the plurality of printed boards 150, because one coupling structure body can be configured and then be set in the mold for molding the resin case 160, setting times can be reduced compared with a case of setting in the mold for molding the resin case 160 per printed board 150.

When resin molding so as to integrate the coupling structure body with the resin case 160, the coupling section 190 may be embedded in the resin of the resin case 160. By embedding the coupling section 190 in the resin of the resin case 160, a firmer integration can be made and also an amount of the resin material required for the resin case 160 can be reduced by the volume of the coupling section 190. However, the semiconductor device 100 of the present example is not limited to this case, and the coupling section 190 may not be embedded in the resin of the resin case 160.

At least one resin block of the plurality of resin blocks 120, 140 may have a depression 142 in the upper surface. In the present example, the depression 142 has been formed in the upper surface of the resin block 140. The depression 142 divides the plurality of terminal pins 130 into two or more groups. In this way, by providing the depression 142, a creeping distance between the divided terminal pins 130 can be made longer. Therefore, the semiconductor device 100 easily satisfies the standards for the creeping distance.

In the present example, the depression 142 divides the plurality of terminal pins 130 into two groups. Among the divided plurality of terminal pins 130, at least one terminal pin 130 provided on a position between the depression 142 and the coupling section 190 may be a monitoring terminal 134 of a main power supply. Particularly, in the present example, the monitoring terminal 134 may be a current monitor terminal of the P terminal 172. On the other hand, the divided terminal pins 130 on the opposite side to the coupling section 190 with the depression 142 as reference may serve as a control terminal 136.

Figure 9:
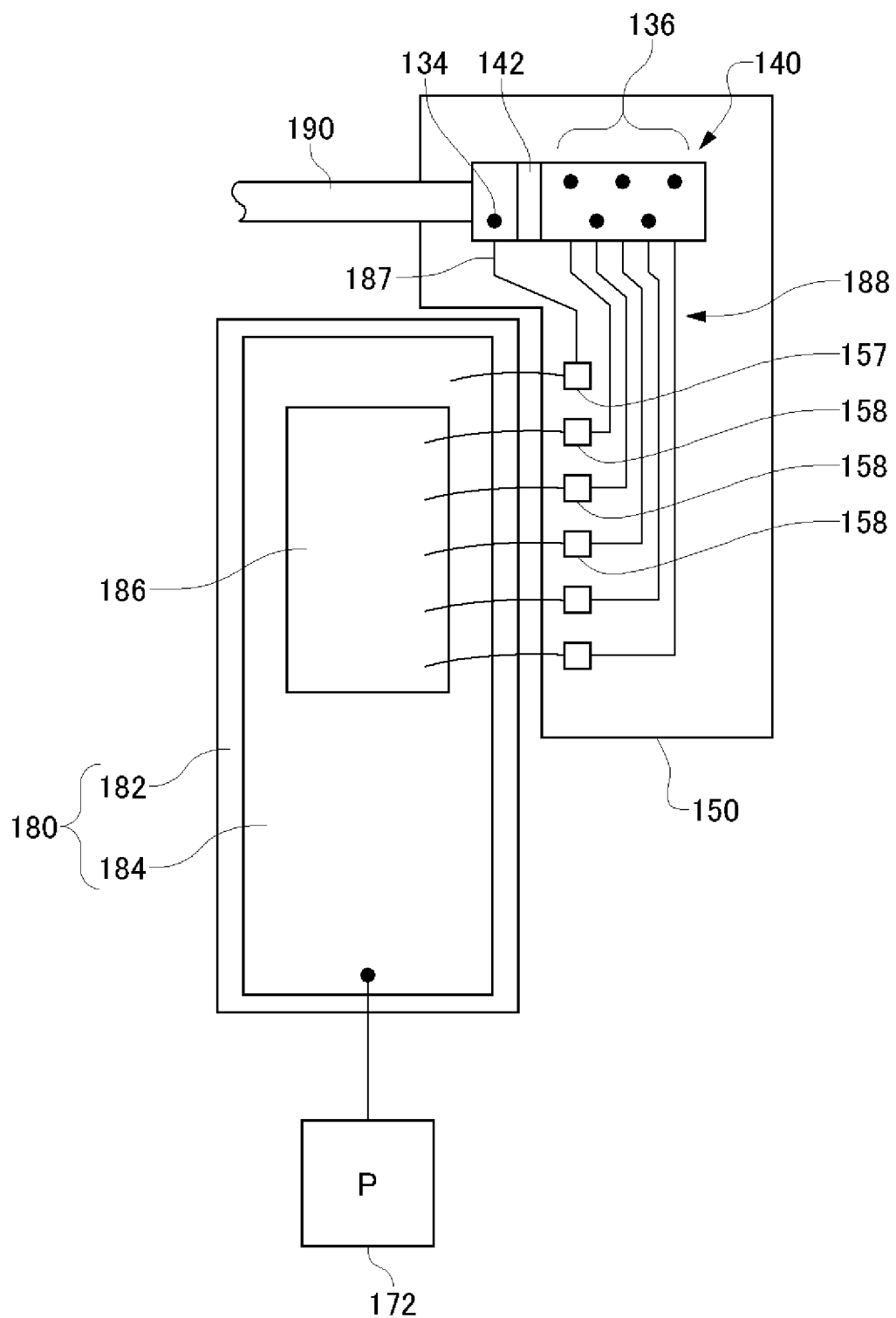
FIG. 9 is a drawing showing an exemplary connection of a terminal pin 130.

FIG. 9 is a drawing showing an exemplary connection of the terminal pin 130. As shown in FIG. 9, the P terminal 172 is electrically connected to one end of the metal foil 184 included in a laminated substrate 180. The other end of the metal foil 184 is electrically connected to an electrode 157 on the printed board 150. A monitoring circuit wiring 187 of a power source is pattern formed between the electrode 157 and the monitoring terminal 134 of the main power supply. Meanwhile, a control terminal of a semiconductor chip 186 is connected to a control electrode 158 on the printed board 150. Then, a control circuit wiring 188 is pattern formed between the control electrode 158 and the control terminal 136.

By arranging at least one terminal pin 130 provided on a position between the depression 142 and the coupling section 190 so as to be the monitoring terminal 134 of the main power supply, a pattern forming so that the monitoring circuit wiring 187 of the power source and the control circuit wiring 188 do not intersect with each other is easily performed.

Figure 10:
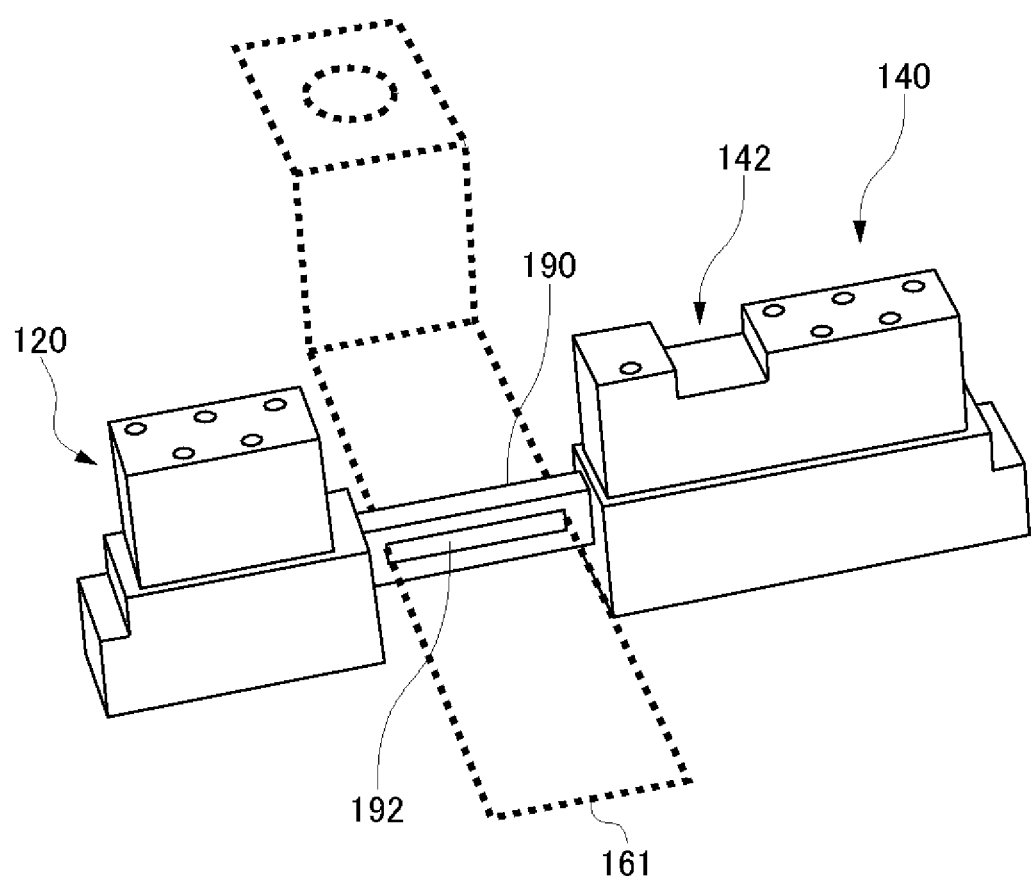
FIG. 10 is a drawing showing one example of a structure including a support section 192 between the resin blocks 120 and 140.

FIG. 10 is a drawing showing one example of a structure including a support section 192 between the resin blocks 120, 140. The present example includes the support section 192 for supporting main terminals between the plurality of resin blocks 120, 140 coupled by the coupling section 190. In the example shown in FIG. 10, the support section 192 supports the U terminal 161 which is one of the main terminals. The support section 192 of the present example may be a slit formed in a width of the U terminal 161 along the longitudinal direction of the coupling section 190. By inserting the U terminal 161 into the slit, the U terminal 161 is supported.

However, the support section 192 is not limited to this case, and may be any object which supports the main terminals. In one example, on a position below or above the coupling section 190, at least a pair of projection sections, which protrude from surfaces of the resin blocks 120, 140 opposite to each other so as to be in parallel with the coupling section 190, may be used as the support section 192. For example, on the position below the coupling section 190, if the pair of projection sections which protrude from the surfaces of the resin blocks 120, 140 opposite to each other are used as the support section 192, the U terminal 161 is arranged so as to be interposed between the lower surface of the coupling section 190 and the projection section, and is supported.

Note that the main terminal supported by the support section 192 is not limited to the U terminal 161. The support section 192 may also support other main terminals such as the V terminal 162 and the W terminal 163. In a case where the main terminal is supported by the support section 192, times of setting the components can be reduced compared with a case of separately setting the printed board 150, the U terminal 161, and the like in the mold for molding the resin case 160.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100 . . . semiconductor device, 102 . . . accommodating section, 110 . . . terminal pin, 112 . . . first press-fit section, 114 . . . second press-fit section, 120 . . . resin block, 121 . . . bottom surface, 122 . . . block through hole, 123 . . . second step difference, 124 . . . first step difference, 125 . . . leg section, 127 . . . locking section, 128 . . . tapered portion, 129 . . . void, 130 . . . terminal pin, 134 . . . monitoring terminal, 136 . . . control terminal, 140 . . . resin block, 148 . . . bonding wire, 150 . . . printed board, 153 . . . board through hole, 154 . . . locking hole, 157 . . . electrode, 158 . . . control electrode, 160 . . . resin case, 161 . . . U terminal, 162 . . . V terminal, 163 . . . W terminal, 164 . . . internal wiring terminal, 172 . . . P terminal, 174 . . . N terminal, 180 . . . laminated substrate, 182 . . . insulating substrate, 184 . . . metal foil, 186 . . . semiconductor chip, 187 . . . monitoring circuit wiring, 188 . . . control circuit wiring, 190 . . . coupling section, 192 . . . support section

What is claimed is:

1. A semiconductor device, comprising:
    a printed board;
    a plurality of pins pressed in the printed board;
    a resin block in which a plurality of through holes are formed, the plurality of pins respectively pressed in the plurality of through holes; and
    a resin case integrally molded with the printed board and the resin block, wherein
    a part of bottom surface sides and side surfaces of the resin block is covered by the resin case.

2. The semiconductor device according to claim 1, wherein
    the printed board has a plurality of board through holes, and
    each of the plurality of pins includes:
        a first press-fit section pressed in the plurality of board through holes and in contact with an inner surface of each board through hole by an elastic force; and
        a second press-fit section pressed in the plurality of through holes of the resin block and in contact with an inner surface of each through hole of the resin block by an elastic force.

3. The semiconductor device according to claim 1, wherein
    a bottom surface of the resin block is formed flat so as to be in close contact with a front surface of the printed board.

4. The semiconductor device according to claim 1, wherein
    the resin block has, in an upper surface, a depression dividing the plurality of pins into two or more groups.

5. The semiconductor device according to claim 1, wherein
    the resin block has a first step difference on a side surface.

6. The semiconductor device according to claim 5, wherein
    the resin block further has, on a part of the side surface, a second step difference having an area larger than that of the first step difference.

7. A semiconductor device, comprising:
    a first printed board;
    a second printed board;
    a first plurality of pins pressed in the first printed board;
    a second plurality of pins pressed in the second printed board;
    a first resin block in which a first plurality of through holes are formed, the first plurality of pins respectively pressed in the first plurality of through holes;
    a second resin block in which a second plurality of through holes are formed, the second plurality of pins respectively pressed in the second plurality of through holes;
    a resin case covering at least a part of the first printed board, the first resin block, the second printed board, and the second resin block; and
    a coupling section coupling the first and second resin blocks across the first and second printed boards.

8. The semiconductor device according to claim 7, wherein
    the coupling section is thinner than the first and second resin blocks.

9. The semiconductor device according to claim 7, wherein the coupling section is embedded in resin of the resin case.

10. The semiconductor device according to claim 7, wherein
a resin material forming the first and second resin blocks and the coupling section has a smaller shrinkage percentage than that of a resin material forming the resin case.

11. The semiconductor device according to claim 7, wherein
at least the first resin block has a depression in an upper surface, the depression dividing the first plurality of pins into two or more groups, and
at least one of the first plurality of pins provided on a position between the depression and the coupling section is a monitoring terminal of a main power supply.

12. The semiconductor device according to claim 7, further comprising, between the first and second resin blocks which are coupled:
a support section for supporting a main terminal.

13. A semiconductor device, comprising:
a printed board;
a plurality of pins pressed in the printed board;
a resin block in which a plurality of through holes are formed, the plurality of pins respectively pressed in the plurality of through holes; and
a resin case integrally molded with at least one of the printed board and the resin block, wherein
the through holes formed in the resin block are tapered on the printed board side.

* * * * *